United States Patent [19]

Potier

[11] Patent Number: 4,705,104

[45] Date of Patent: Nov. 10, 1987

[54] HEAT EXCHANGER, IN PARTICULAR FOR A MOTOR VEHICLE, HAVING A RIGID CONNECTION BETWEEN A BUNDLE OF TUBES AND A WATER BOX AND PERFORATED PLATE ASSEMBLY

[75] Inventor: Michel Potier, Rambouillet, France

[73] Assignee: Valeo, Paris, France

[21] Appl. No.: 703,918

[22] Filed: Feb. 21, 1985

[30] Foreign Application Priority Data

Feb. 27, 1984 [FR] France .................... 84 02964

[51] Int. Cl.⁴ .............................................. F28D 1/00
[52] U.S. Cl. ...................................... 165/149; 165/173
[58] Field of Search ................................. 165/149, 173

[56] References Cited

U.S. PATENT DOCUMENTS

| 4,230,176 | 10/1980 | Crews | 165/149 X |
| 4,465,126 | 8/1984 | Winterer | 165/149 X |
| 4,534,407 | 8/1985 | Lardner | 165/149 X |

FOREIGN PATENT DOCUMENTS

| 2418132 | 11/1975 | Fed. Rep. of Germany | 165/149 |
| 2494828 | 11/1980 | France | 165/149 |
| 2522401 | 2/1982 | France | 165/149 |
| 2086561 | 5/1982 | United Kingdom | 165/149 |

Primary Examiner—Albert W. Davis, Jr.
Assistant Examiner—Peggy A. Neils
Attorney, Agent, or Firm—Dennison, Meserole, Pollack & Scheiner

[57] ABSTRACT

The invention relates to a heat exchanger including a bundle of tubes in which the ends of the tubes (32) in the bundle (30) are sealed in the holes through a perforated plate (36) to which a water box (42) is fixed. The water box and perforated plate assembly includes means (44) co-operating with the sides of the fins (34) of the tubes (32) to oppose displacement of the bundle relative to the perforated plate by pivoting or by torsion. The invention is particularly applicable to heat exchangers for motor vehicles.

9 Claims, 7 Drawing Figures

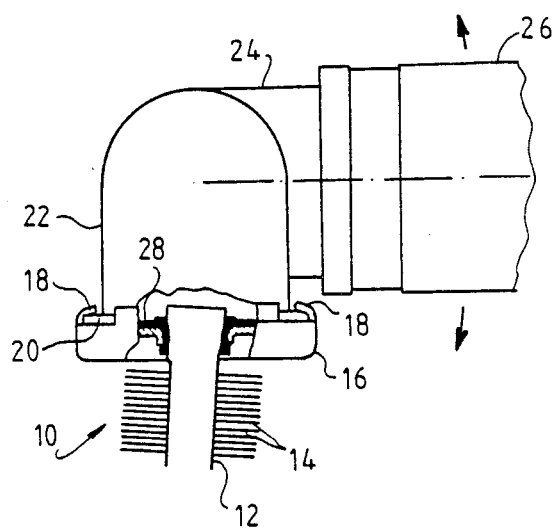
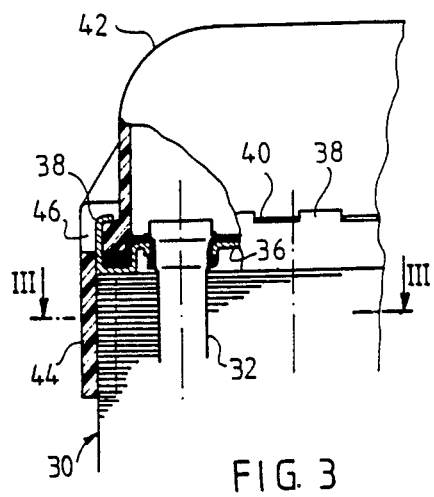
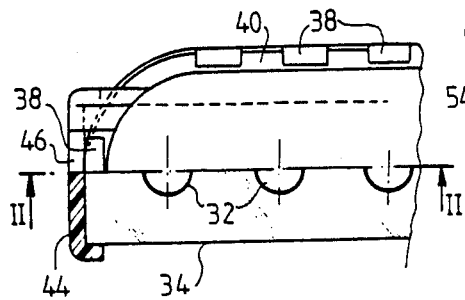
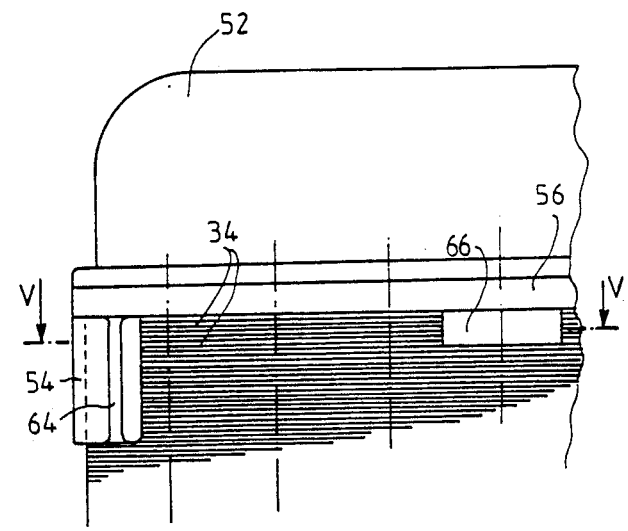
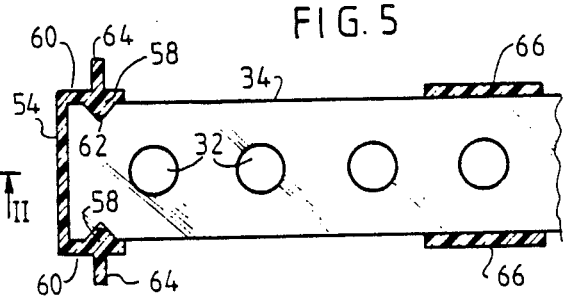

HEAT EXCHANGER, IN PARTICULAR FOR A MOTOR VEHICLE, HAVING A RIGID CONNECTION BETWEEN A BUNDLE OF TUBES AND A WATER BOX AND PERFORATED PLATE ASSEMBLY

The invention relates to a heat exchanger in particular for a motor vehicle, having a rigid connection between a bundle of tubes and an assembled water box and perforated plate, in which the ends of the tubes in the bundle are mounted in sealed manner through the holes of a perforated plate on which a water box is fixed.

BACKGROUND OF THE INVENTION

Various means may be used for obtaining the desired sealing between the ends of the tubes and the sides of the holes in the perforated plate, and may include a sheet of elastomer or the like covering one face of the perforated plate and having collars engaged in the holes therethrough between the ends of the tubes and the sides of said holes. Other means are also provided to prevent axial displacement of the ends of the tubes through the holes in the perforated plate.

While such a heat exchanger is being handled prior to or during its assembly into a vehicle, or after it has been assembled in a vehicle, it may happen in some cases, that there is relative movement between the bundle of tubes and the perforated plate, in particular due to pivoting or to torsion, and especially when the bundle comprises a single row of aligned tubes. These relative movements degrade the sealing between the ends of the tubes and the sides of the holes through the perforated plate, for example by crushing or cutting the collars of elastomer engaged between the ends of the tubes and the sides of the holes, thus giving rise to possible leaks.

Preferred embodiments of the present invention avoid these drawbacks in a simple, cheap and reliable manner.

SUMMARY OF THE INVENTION

To this end, the present invention provides a heat exchanger of the above-mentioned type in which the perforated plate and water box assembly includes means co-operating with fins or the like provided on the tubes of the bundle and opposing relative displacement, in particular by pivoting or torsion, of the bundle relative to the perforated plate.

Advantageously, these means may be constituted by tabs projecting from the longitudinal ends of the water box and extending parallel to the direction of the tubes beyond the perforated plate in such a manner as to receive the longitudinal ends of at least some of the fins in the bundle.

In a variant embodiment, which is particularly applicable to the case of a perforated plate made of plastic material, the above-mentioned means comprise tabs projecting from the perforated plate and extending parallel to the tubes along the sides of the bundle formed by the edges of the fins, at least some of said tabs being formed at the longitudinal ends of the perforated plate and having a U-shaped cross-section to receive the longitudinal ends of the fins.

Generally speaking, the tabs extend over a length which is considerably less than the corresponding length of the bundle (i.e. parallel to the direction of the tubes), but nevertheless serve to hold the bundle relative to the perforated plate against torsion or pivot movements which could damage sealing.

BRIEF DESCRIPTION OF THE DRAWINGS

Three embodiments of the invention are described by way of example with reference to the accompanying drawings, in which:

FIG. 1 is a diagrammatic view of a portion of a prior art heat exchanger showing the bundle pivoting relative to the perforated plate;

FIG. 2 is a diagrammatic view of a portion of a heat exchanger in accordance with the invention in section on a line II—II of FIG. 3;

FIG. 3 is a view from above in half-section on a line III—III of FIG. 2;

FIG. 4 is a diagrammatic view of a portion of another embodiment of the invention;

FIG. 5 is a section view on a line V—V of FIG. 4;

MORE DETAILED DESCRIPTION

Figure 6:
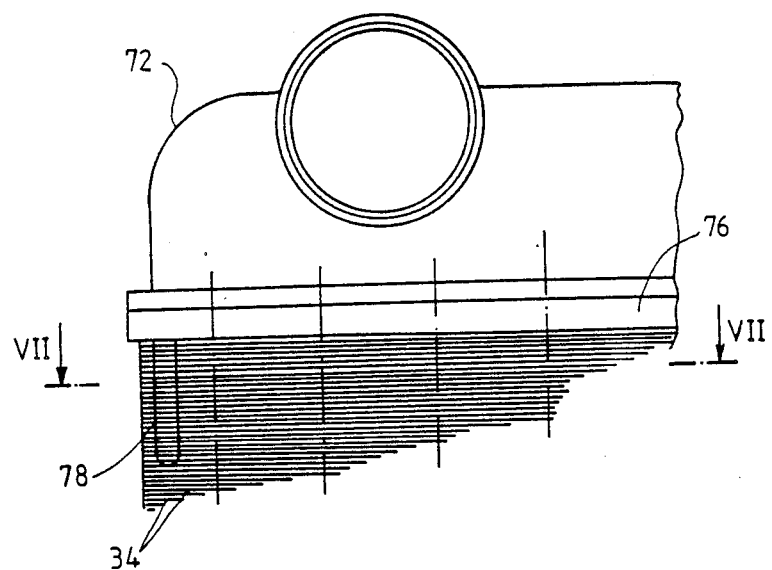
FIG. 6 is a diagrammatic view of a portion of a third embodiment of the invention.

Reference is made initially to FIG. 1 which shows a portion of a prior art heat exchanger mounted in a motor vehicle.

The heat exchanger shown includes a bundle of tubes 10 constituted by a single row of aligned tubes 12 fitted with plane parallel fins 14 which extend perpendicularly to the direction in which the tubes 12 extend. The ends of the tubes are mounted in a sealed manner in holes in a perforated plate 16 having crimping tabs 18 at its periphery, which tabs are folded down over the peripheral rims 20 of a conventional water box 22. The water box includes at least one inlet or outlet tube 24 for a cooling liquid, which tube is connected to a liquid circulation duct 26 which constitutes a part of the cooling system for the motor of a vehicle or part of the heating system for the vehicle cabin. The ends of the tubes 12 are sealed to the perforated plate by means of a sheet of elastomer 28 which covers one face of the plate 16 and which includes collars which are pinched between the sides of the holes through the perforated plate and the ends of the tubes 12.

It has been observed that when the heat exchanger is mounted in a vehicle, the handling to which it is subjected and the forces exerted on the water boxes 22, in particular when the ducts 26 are being connected to the inlet or outlet tubes 24, can cause relative displacement of the or both perforated plates 16 relative to the bundle 10 by torsion or pivoting as shown in FIG. 1. This causes the elastomer sheet collars 28 to be crushed between the ends of the tubes and the sides of the holes through the plate, and such crushing may split the elastomer and hence give rise to liquid leaks. Also, when the vehicle is in use, parasitic movements may be transmitted to the water box 22 by the ducts 26 and can lead to the same drawbacks.

In some cases, the same phenomenon can also occur when the bundle of tubes 10 comprises two parallel rows of tubes 12.

As mentioned above, the present invention seeks to avoid this drawback.

Reference is now made to FIGS. 2 and 3 which show a first embodiment of the invention.

These figures show a portion of a heat exchanger in accordance with the invention, the heat exchanger comprising a bundle 30 of tubes 32 having plane and parallel fins 34, with the ends of the tubes 32 being sealed in the holes through a metal perforated plate 26 having crimping tabs 38 at its periphery which are folded down over the peripheral rim 40 of a water box 42 which is molded from plastics material.

In accordance with the invention, the molded water box 42 includes tabs 44 at its longitudinal ends which are U-shaped in transverse cross-section (i.e. perpendicular to the axis of the tubes 32) so as to receive the ends of the rectangular fins 34 with very little play. These tabs 44, only one of which is shown in the drawing, extend parallel to the tubes 32 beyond the perforated plate 36 and, in order allow the crimping tabs 38 to be folded down at the longitudinal end of the perforated plate, the tabs 44 have slots or openings 46 through which the crimping tabs 38 are passed.

In order to allow the longitudinal ends of the fins 34 in the bundle 30 to be applied against the inside faces of the tabs 44, the length of the fins 34 is equal to the overall length of the perforated plate 36 and the longitudinal ends of the perforated plate are rounded convexly so that the fins 34 may project at least partially at their longitudinal ends beyond the periphery of the perforated plate 36.

As can be seen in FIG. 2, the tabs 44 do not extend over the entire height of the bundle 30, but only over a distance of about 20 to 50 mm, whereas the height of the bundle lies in the range of about 400 mm to about 800 mm. The tabs 44 of the water box 42 serve to hold the bundle 30 fixed relative to the plate 36 against pivoting or torsion movements which could destroy the sealing where the ends of the tubes 32 are engaged in the holes in the plate 36.

Reference is now made to FIGS. 4 and 5 which show another embodiment of the invention.

In these figures, the plate 56 is made of plastics material like the water box 52, such that the water box is assembled to the plate 56 by welding, rather than by crimping.

In accordance with the invention, the plate 56 is integrally molded with tabs 54 at its longitudinal ends, these tabs are similar to the tabs 44 on the water box 42 in the embodiment shown in FIGS. 2 and 3, and they extend from the peripheral rim of the plate 56 parallel to the tubes 32 of the bundle and have a U-shaped cross-section to receive the longitudinal ends of the rectangular fins 34 with substantially no play.

Further, rectilinear ribs 58 are formed on the internal faces of the two parallel branches 60 of the tabs 54 to engage in aligned V-shaped notches formed in the longitudinal edges of the fins 34.

Strengthening ribs 64 may also be formed on the outside faces of the parallel branches 60.

As shown, the plate 56 may also include plane tabs 66 on its longitudinal sides, with the tabs 66 extending along the longitudinal sides of the fins 34 over a small portion of their height.

Figure 7:
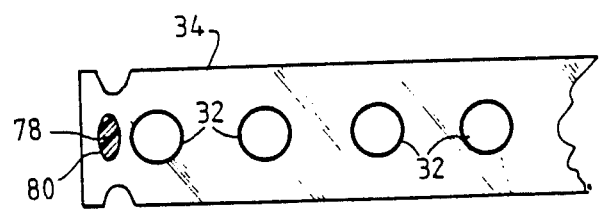
FIG. 7 is a section view on a line VII—VII of FIG. 6.

In the embodiment shown in FIGS. 6 and 7, the perforated plate 76 is made of molded plastics material and is welded to the rim of a water box 72 which is likewise molded in plastics material.

The perforated plate 76 is integrally molded with fingers 78 at each of its longitudinal ends, which fingers extend parallel to the tubes 32. These fingers engage in aligned holes 80 of corresponding shape formed through the plane fins 34.

In the embodiment shown, the finger 78 has an oval or elliptical cross-section and the holes 80 have a corresponding shape and size such that the finger 78 is a substantially play-free fit in the holes 80.

The various embodiments of the invention described with reference to the figures serve to hold the bundle of tubes in its correct position such that the tubes are oriented perpendicularly to the plane defined by the perforated plate, and they prevent the bundle of tubes from tilting relative to said plane thus guaranteeing continued sealing where the ends of the tubes are engaged in the holes through the perforated plate.

What is claimed:

1. A heat exchanger for a motor vehicle including a tube and fin bundle and a perforated plate sealingly interengaged with each of the tubes in said bundle, and a water box mounted on said perforated plate to define an assembly therewith, said tube and fin bundle comprising a plurality of fluid conducting tubes arranged in generally aligned spaced parallel array with respect to each other and a plurality of heat exchanging fins arranged in spaced stacked array around said tubes and generally perpendicular thereto, said fins including free ends extending beyond the outermost tube on each side of said tube array, tab means carried by said water box assembly extending in generally parallel relation with said tubes along the free ends of a portion of said fin array a distance sufficient to achieve rigidity between said tube and plate assembly but significantly less than the full height of said tube and fin bundle, said tabs being configured to embrace the ends of said fins to resist torsional displacement of tube and fin bundle relative to said plate and water box assembly.

2. A heat exchanger according to claim 1, wherein the tabs extend from the longitudinal ends of the assembly and have a substantially U-shaped cross-section.

3. A heat exchanger according to claim 1, wherein the water box is fixed to the perforated plate by means of crimping tabs on the perforated plate which are folded down over a peripheral rim of the the water box, and wherein the perforated plate has convex rounded longitudinal ends such that the longitudinal ends of the fins project at least partially beyond the longitudinal ends of the perforated plate.

4. A heat exchanger according to claim 3, wherein the tabs at the longitudinal ends of the water box each include a slot or opening through which a crimping tab provided at the corresponding longitudinal end of the perforated plate is passed prior to folding down over said rim.

5. A heat exchanger according to claim 1, wherein the tabs are formed at the longitudinal ends of the perforated plate and extend along the sides of the bundle formed by the edges of the fins, said tabs having U-shaped cross-section to receive the longitudinal ends of the said fins.

6. A heat exchanger according to claim 5, wherein each U-shaped tab includes two parallel arms with the inside faces of the two parallel arms of the tabs including respective rectilinear ribs, said fins, at said longitudinal ends, including aligned notches receiving said ribs.

7. A heat exchanger according to claim 5, wherein the perforated plate also includes, on its longitudinal sides, plane tabs which extend over the sides of the fins a distance sufficient to achieve rigidity between said tube and plate assembly but significantly less than the full length of said tube and said fin bundle.

8. A heat exchanger according to any one of claims 5 to 7, wherein the perforated plate and the water box are both made of plastics material and are fixed to each other by welding.

9. A heat exchanger according to claim 1 or 5, wherein the bundle comprises a single row of parallel tubes having plane rectangular fins.

* * * * *